US011986864B2

(12) United States Patent
Masuda et al.

(10) Patent No.: US 11,986,864 B2
(45) Date of Patent: May 21, 2024

(54) CLEANING APPARATUS

(71) Applicant: DISCO CORPORATION, Tokyo (JP)

(72) Inventors: Yukiyasu Masuda, Tokyo (JP);
Hiromitsu Yoshimoto, Tokyo (JP);
Zentaro Kawasaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 205 days.

(21) Appl. No.: 17/450,570

(22) Filed: Oct. 12, 2021

(65) Prior Publication Data

US 2022/0126331 A1    Apr. 28, 2022

(30) Foreign Application Priority Data

Oct. 22, 2020    (JP) .................. 2020-177330

(51) Int. Cl.
| | | |
|---|---|---|
| *B08B 3/12* | (2006.01) | |
| *B08B 13/00* | (2006.01) | |
| *H01L 21/67* | (2006.01) | |

(52) U.S. Cl.
CPC .............. *B08B 3/123* (2013.01); *B08B 13/00* (2013.01); *H01L 21/67023* (2013.01)

(58) Field of Classification Search
CPC ......... H01L 21/67017; H01L 21/67023; H01L 21/67028; H01L 21/6704; H01L 21/67051;

(Continued)

(56) References Cited

U.S. PATENT DOCUMENTS 5,271,798 A * 12/1993 Sandhu ................. C23F 1/02
257/E23.179
5,339,842 A *  8/1994 Bok .................... B08B 3/12
134/155

(Continued)

FOREIGN PATENT DOCUMENTS

EP    1270094 A2 *  1/2003    ............... B08B 3/12
JP    07211685 A    8/1995

(Continued)

OTHER PUBLICATIONS

US Vacuum Pumps LLC, Liquid Separator, Aug. 12, 2020 (Year: 2020).*

(Continued)

*Primary Examiner* — Spencer E. Bell
*Assistant Examiner* — Omair Chaudhri
(74) *Attorney, Agent, or Firm* — Greer, Burns & Crain, Ltd.

(57) ABSTRACT

A cleaning apparatus includes a spinner table for holding a workpiece thereon, a cleaning nozzle for supplying cleaning water to the workpiece held on the spinner table, an ultrasonic vibrator for applying ultrasonic vibrations to the cleaning water supplied from the cleaning nozzle to the workpiece, a water layer forming unit for forming a layer of the cleaning water in a clearance between the cleaning nozzle and the workpiece, the water layer forming unit having a cover surrounding the cleaning nozzle, and a drain unit for draining the cleaning water out of the cleaning apparatus, the drain unit having a flow channel for allowing the cleaning water supplied from the cleaning nozzle to the workpiece to flow therethrough.

10 Claims, 4 Drawing Sheets

(58) Field of Classification Search
CPC ......... H01L 21/67057; H01L 21/67075; H01L 21/6708; H01L 21/67086; B08B 3/12–123
See application file for complete search history.

(56) References Cited

U.S. PATENT DOCUMENTS

| | | | | |
|---|---|---|---|---|
| 5,647,090 | A * | 7/1997 | Yang | A47K 17/00 15/322 |
| 6,269,517 | B1 * | 8/2001 | Dornier | B08B 3/024 15/322 |
| 6,290,863 | B1 * | 9/2001 | Morgan | H01L 21/6708 216/99 |
| 7,367,345 | B1 * | 5/2008 | Hemker | G03F 7/70341 134/115 R |
| 7,464,719 | B2 * | 12/2008 | Garcia | C25D 5/34 134/99.1 |
| 7,997,288 | B2 * | 8/2011 | Ravkin | B08B 3/04 34/407 |
| 8,464,736 | B1 * | 6/2013 | Lenz | H01L 21/67017 134/108 |
| 2001/0037819 | A1 * | 11/2001 | Mitsumori | B08B 3/041 134/186 |
| 2002/0023671 | A1 * | 2/2002 | Mitsumori | H01L 21/6708 134/172 |
| 2002/0026976 | A1 * | 3/2002 | Mitsumori | H01L 21/67051 156/73.1 |
| 2002/0086535 | A1 * | 7/2002 | Adler | H01L 21/6708 257/E21.309 |
| 2004/0035451 | A1 * | 2/2004 | Mitsumori | B08B 3/12 134/1 |
| 2004/0123878 | A1 * | 7/2004 | Cheng | B08B 3/123 134/32 |
| 2004/0197433 | A1 * | 10/2004 | Terada | B23K 26/146 257/E23.179 |
| 2005/0087210 | A1 * | 4/2005 | Yeo | B08B 3/12 134/25.4 |
| 2005/0217703 | A1 * | 10/2005 | O'Donnell | H01L 21/6708 134/21 |
| 2006/0118132 | A1 * | 6/2006 | Bergman | B08B 3/02 134/1 |
| 2007/0177125 | A1 * | 8/2007 | Shibazaki | H01L 21/6838 355/72 |
| 2008/0266367 | A1 * | 10/2008 | Ravkin | B08B 3/04 347/85 |
| 2009/0056767 | A1 * | 3/2009 | Iwata | B08B 3/04 134/104.4 |
| 2009/0081810 | A1 * | 3/2009 | Hamada | H01L 21/67051 438/5 |
| 2010/0051068 | A1 * | 3/2010 | Miyanari | H01L 21/6708 134/104.2 |
| 2011/0297182 | A1 * | 12/2011 | Choi | H01L 21/67057 134/1 |
| 2015/0298031 | A1 * | 10/2015 | Crocker | B08B 3/14 210/435 |
| 2016/0243593 | A1 * | 8/2016 | Tanaka | H01L 21/67046 |
| 2019/0088510 | A1 * | 3/2019 | Ishibashi | B08B 7/028 |
| 2019/0151904 | A1 * | 5/2019 | Bauer | B08B 3/04 |
| 2020/0023414 | A1 * | 1/2020 | Pruiett | A47L 11/4088 |
| 2023/0175947 | A1 * | 6/2023 | Heinrichs | C02F 3/02 73/38 |

FOREIGN PATENT DOCUMENTS

| | | |
|---|---|---|
| JP | 11031643 A | 2/1999 |
| JP | 2012151270 A | 8/2012 |
| JP | 2020000995 A | 1/2020 |
| KR | 2020110006374 U | 6/2011 |
| WO | WO-2022024271 A1 * | 2/2022 ......... B01F 23/2323 |

OTHER PUBLICATIONS

Search report issued in counterpart Singapore patent application No. 10202111340S, dated Dec. 5, 2022.

* cited by examiner

CLEANING APPARATUS

BACKGROUND OF THE INVENTION

Field of the Invention

The present invention relates to a cleaning apparatus for use in cleaning a workpiece.

Description of the Related Art

After a plate-shaped workpiece such as a semiconductor wafer has been processed by way of laser ablation or the like, the workpiece is cleaned to remove swarf or debris deposited on one surface of the workpiece (see, for example, JP H7-211685A). Specifically, first, the other surface of the workpiece is held on a spinner table of a cleaning apparatus. Next, the spinner table with the workpiece held thereon is rotated about its central axis, and a nozzle of the cleaning apparatus supplies water for cleaning (hereinafter referred to as "cleaning water") to the one surface of the workpiece rotating with the spinner table. As a result, the cleaning water moves radially outwardly of the workpiece under centrifugal forces generated by the rotation of the workpiece, so that the swarf will be removed from the one surface of the workpiece together with the cleaning water.

Incidentally, the swarf produced when the workpiece is processed may be deposited in grooves defined in the workpiece, for example. If the swarf is deposited in the grooves, then the deposited swarf may not necessarily be removed in its entirety from the workpiece only by supplying and moving the cleaning water. In view of the problem, there has been proposed a technology that facilitates the removal of swarf deposited in grooves in a workpiece by propagating ultrasonic vibrations in cleaning water supplied to the workpiece (see, for example, JP H11-31643A).

SUMMARY OF THE INVENTION

According to the above process in which the cleaning water is supplied to the rotating workpiece, however, the cleaning water upon collision with the workpiece tends to be scattered around together with the swarf, possibly causing the swarf to be deposited again on the workpiece.

It is therefore an object of the present invention to provide a cleaning apparatus that prevents cleaning water supplied to a workpiece from being scattered around and causing swarf in the cleaning water from being deposited again on the workpiece.

In accordance with an aspect of the present invention, there is provided a cleaning apparatus including a spinner table for holding a workpiece thereon, a cleaning nozzle for supplying cleaning water to the workpiece held on the spinner table, an ultrasonic vibrator for applying ultrasonic vibrations to the cleaning water supplied from the cleaning nozzle to the workpiece, a water layer forming unit for forming a layer of the cleaning water in a clearance between the cleaning nozzle and the workpiece, the water layer forming unit having a cover surrounding the cleaning nozzle, and a drain unit for draining the cleaning water out of the cleaning apparatus, the drain unit having a flow channel for allowing the cleaning water supplied from the cleaning nozzle to the workpiece to flow therethrough.

Preferably, the cleaning apparatus further includes an external nozzle for supplying the cleaning nozzle toward a gap between the cover of the water layer forming unit and the workpiece, on the outside of the cover.

Preferably, the flow channel of the drain unit includes a first flow channel having an end connected to the cover of the water layer forming unit, a joint region connected to another end of the first flow channel, and a second flow channel having an end connected to the joint region.

Preferably, the drain unit further includes a turbidimeter for detecting a turbidity of the cleaning water flowing through the flow channel in determining whether cleaning of the workpiece has been completed or not.

Since cleaning apparatus according to the aspect of the present invention includes the water layer forming unit having the cover that surrounds the cleaning nozzle, much of the cleaning water supplied from the cleaning nozzle is confined in the cover, thereby forming a layer of the cleaning water in the clearance between the cleaning nozzle and the workpiece. Therefore, the cleaning water supplied from the cleaning nozzle to the workpiece is less likely to be scattered around, and swarf contained in the cleaning water is prevented from being deposited again on the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENTS

Figure 1:
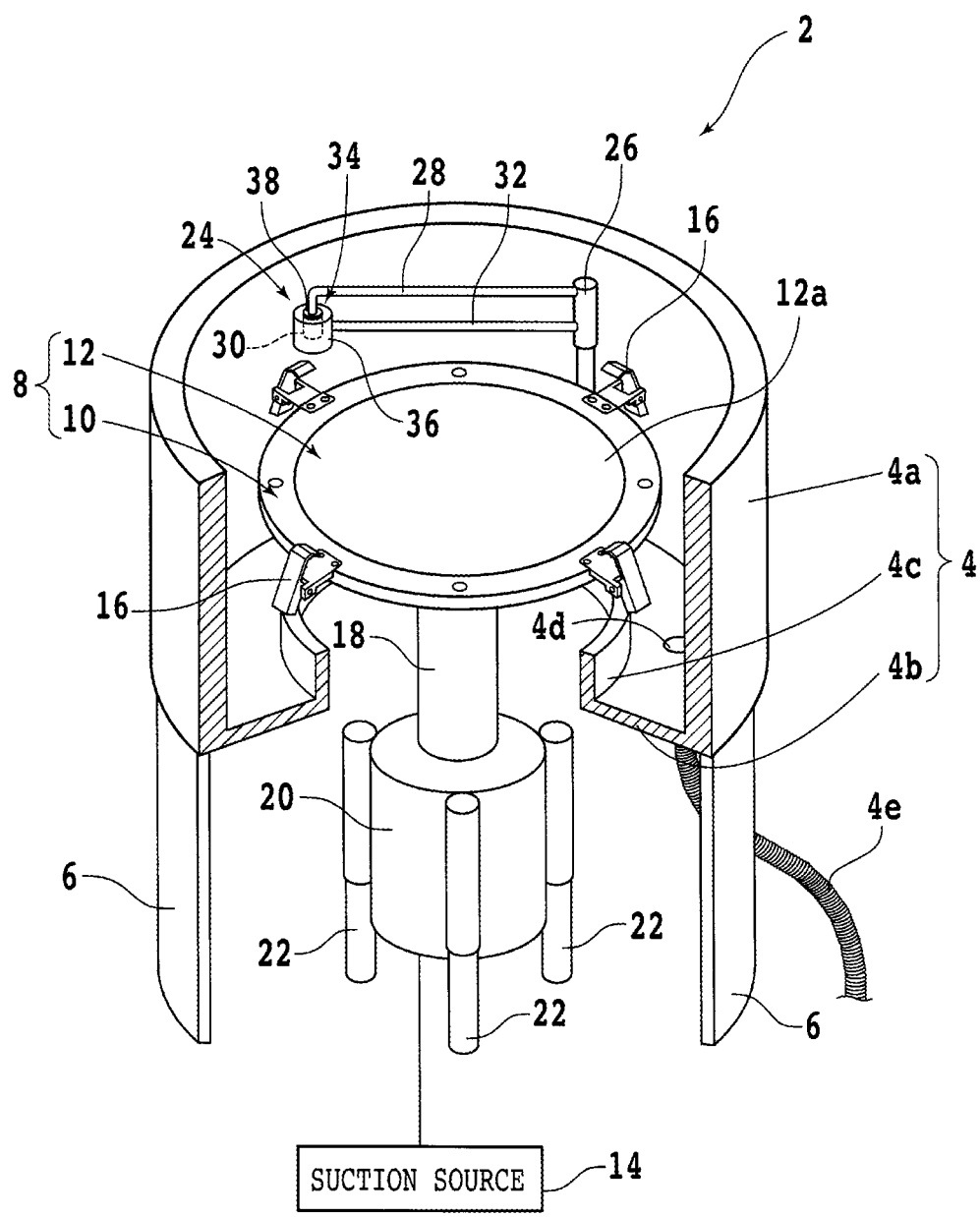
FIG. 1 is a perspective view of a cleaning apparatus according to an embodiment of the present invention.
Figure 2:
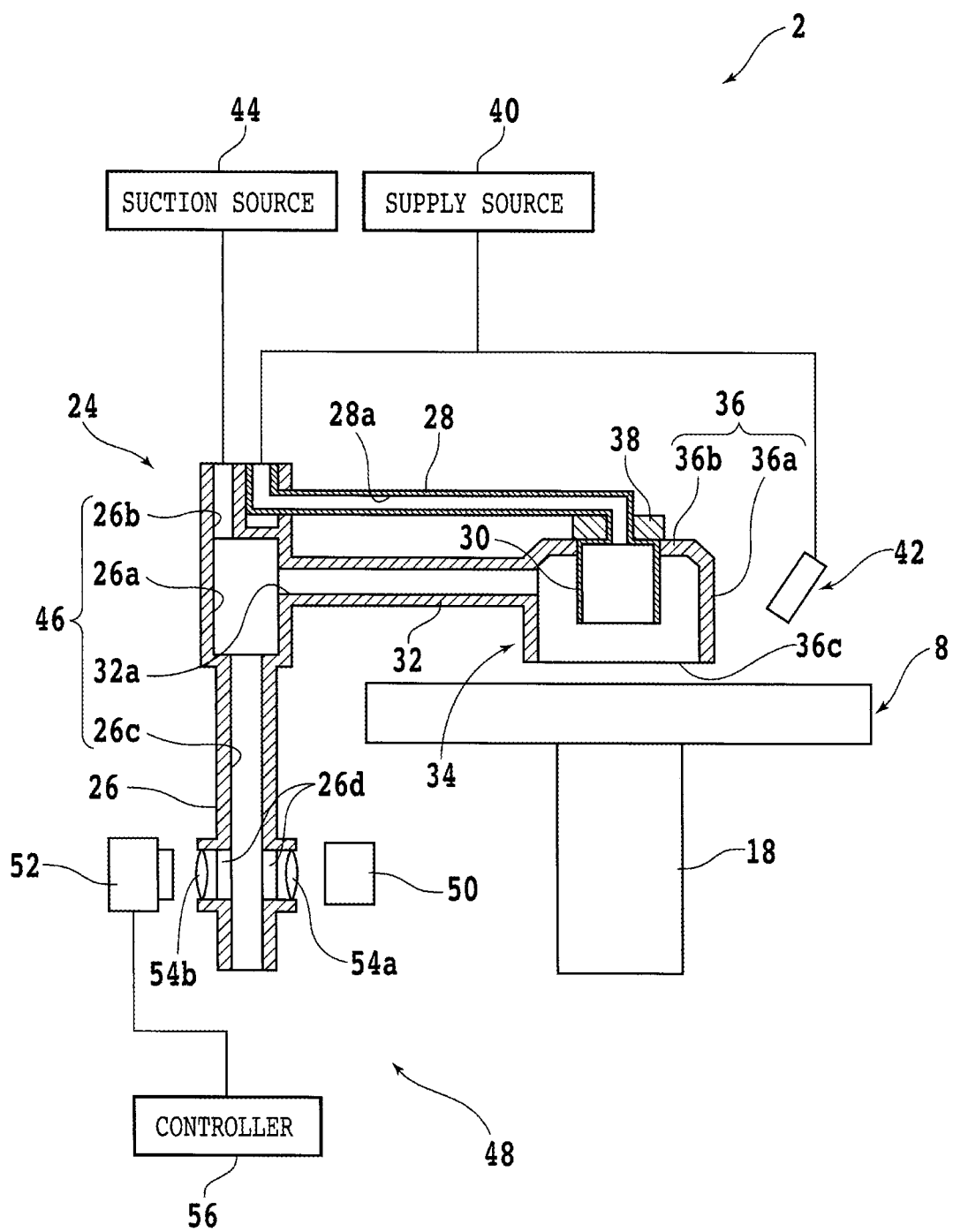
FIG. 2 is a side elevational view, partly in cross section and block form, of the cleaning apparatus.
Figure 3:
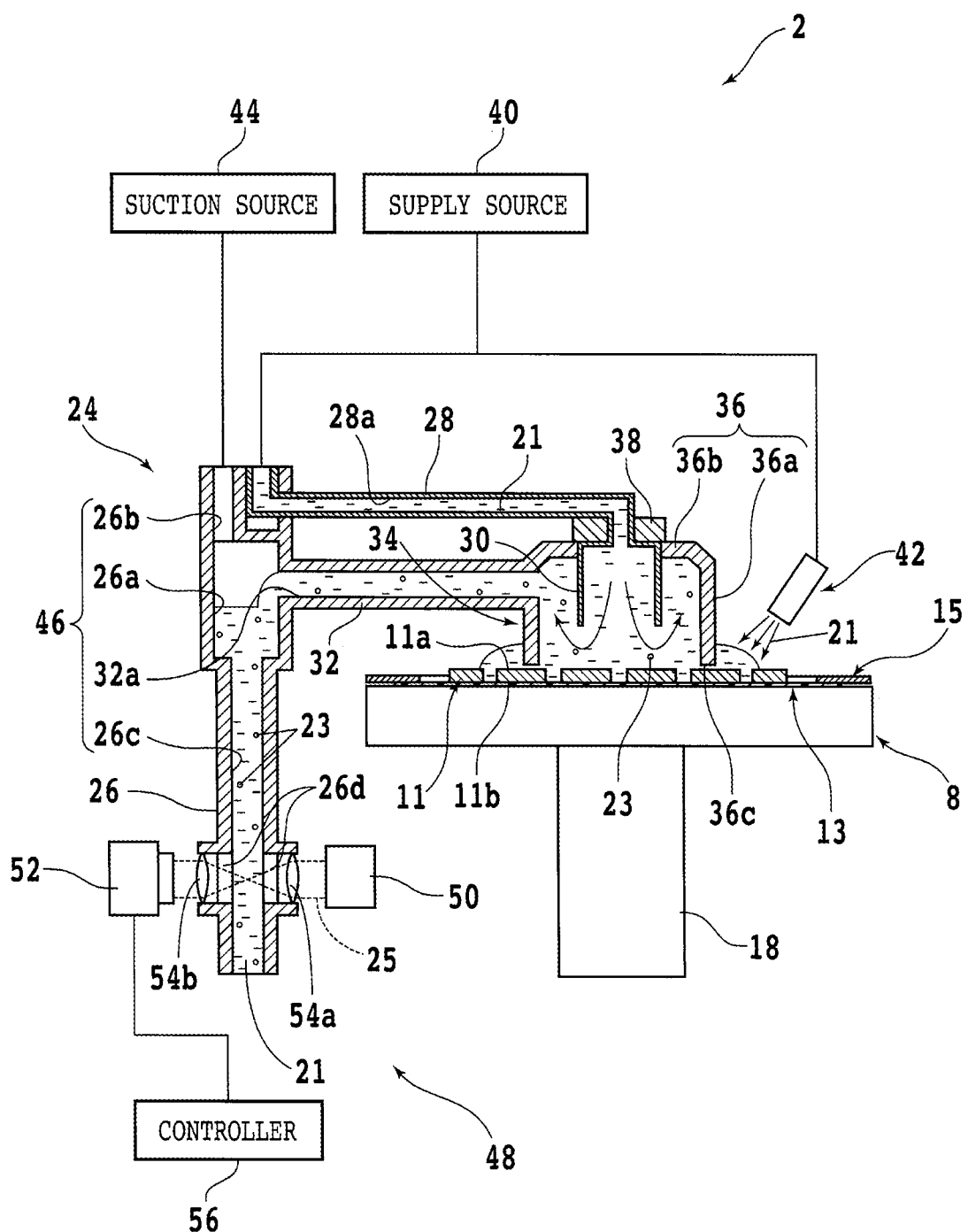
FIG. 3 is a side elevational view, partly in cross section and block form, illustrating the manner in which a workpiece is cleaned by the cleaning apparatus.

A cleaning apparatus according to a preferred embodiment of the present invention will be described in detail hereinbelow with reference to the accompanying drawings. FIG. 1 illustrates in perspective the cleaning apparatus, denoted by 2, according to the present embodiment. FIG. 2 illustrates the cleaning apparatus 2 in side elevation, and FIG. 3 illustrates in side elevation the manner in which a workpiece 11 is cleaned by the cleaning apparatus 2. In FIGS. 1 through 3, some components of the cleaning apparatus 2 are omitted from illustration for illustrative purposes. In FIGS. 1 through 3, moreover, some components are illustrated in cross section, and some components are illustrated in functional block form.

The cleaning apparatus 2 according to the present embodiment is used in cleaning a plate-shaped workpiece 11 such as a semiconductor wafer, as illustrated in FIG. 3, and has a cleaning case 4 with a space defined therein for accommodating the workpiece 11 therein, as illustrated in FIG. 1. The cleaning case 4 includes a hollow cylindrical outer circumferential wall 4a having an upward opening, for example.

The outer circumferential wall 4a has a lower end connected to an outer circumferential edge of an annular bottom wall 4b. The bottom wall 4b has an inner circumferential edge connected to a lower end of a hollow cylindrical inner circumferential wall 4c having an upward opening. The upward opening of the inner circumferential wall 4c is thus smaller in diameter than the upward opening of the outer circumferential wall 4a. Furthermore, the height, i.e., the axial length, of the inner circumferential wall 4c is lower than the height, i.e., the axial length, of the outer circumferential wall 4a.

A plurality of (three in the present embodiment) legs 6 that extend downwardly from the cleaning case 4 are fixed to the junction where the outer circumferential wall 4a and the bottom wall 4b are joined to each other, i.e., the lower end of the cleaning case 4. The legs 6 are spaced at equal angular intervals in the circumferential directions of the outer circumferential wall 4a. The cleaning case 4 is positioned at a certain height from a floor, not depicted, of an installation area where the cleaning apparatus 2 is installed, for example.

A disk-shaped spinner table 8 that is larger in diameter than the upward opening of the inner circumferential wall 4c is disposed radially inwardly of the outer circumferential wall 4a and upwardly of the inner circumferential wall 4c. The spinner table 8 includes a disk-shaped frame body 10 made of a metal, typically stainless steel, for example. The frame body 10 has a recess defined in an upper surface thereof and having a circular opening defined in an upper end thereof. A disk-shaped porous holding plate 12 made of ceramic or the like is fixedly mounted in the recess in the frame body 10.

The holding plate 12 has a lower surface connected to a suction source 14 (see FIG. 1) such as an ejector through a fluid channel, not depicted, defined in the frame body 10, a valve, etc., not depicted. When the workpiece 11 is placed on an upper surface 12a of the holding plate 12 and the valve is opened to allow a negative pressure generated by the suction source 14 to act on the upper surface 12a through the fluid channel, the workpiece 11 has its lower surface 11b (see FIG. 3) attracted under suction to the spinner table 8.

Incidentally, for cleaning the workpiece 11 on the cleaning apparatus 2 according to the present embodiment, as illustrated in FIG. 3, a circular adhesive tape 13 larger than the workpiece 11 is affixed to the lower surface 11b of the workpiece 11. Further, the adhesive tape 13 has an outer circumferential portion fixed to an annular frame 15. According to the present embodiment, therefore, the lower surface 11b of the workpiece 11 is held on the spinner table 8 with the adhesive tape 13 interposed therebetween, and the upper surface 11a of the workpiece 11 is cleaned.

As illustrated in FIG. 1, four clamps 16 are disposed at circumferentially spaced intervals on an outer circumferential portion of the spinner table 8 for clamping the annular frame 15 that supports the workpiece 11 at respective four locations. The clamps 16 convert centrifugal forces generated by the rotation of the spinner table 8 into downward forces and secure the annular frame 15 on the spinner table 8 with the downward forces. Therefore, the annular frame 15 thus clamped in position are prevented from being dislodged off the spinner table 8 while the spinner table 8 is in rotation.

A rotary actuator 20 such as an electric motor is connected to a lower surface of the frame body 10 by a cylindrical spindle 18 that is vertically elongate. When the rotary actuator 20 is energized, the spinner table 8 is rotated about its central axis by the rotary power transmitted from the rotary actuator 20 to the spindle 18. Note that a plurality of (three in the present embodiment) legs 22 are mounted at angular intervals on a lower portion of the rotary actuator 20. The rotary actuator 20 is installed on the floor of the installation area by the legs 22, for example.

The cleaning apparatus 2 includes a cleaning unit 24 disposed near the spinner table 8. The cleaning unit 24 includes a vertically elongate shaft 26 disposed sideways of the spinner table 8. The cleaning unit 24 includes a horizontally elongate first arm 28 having a proximal end connected to an upper end portion of the shaft 26, and a cleaning nozzle 30 connected to a distal end of the first arm 28 for discharging cleaning water 21 (see FIG. 3) downwardly.

The cleaning unit 24 also includes a horizontally elongate tubular second arm 32 having a proximal end connected to the shaft 26 below the upper end portion of the shaft 26 to which the first arm 28 is connected. The second arm 32 has a distal end connected to a water layer forming unit 34 for forming a layer of the cleaning water 21 in a clearance between the workpiece 11 held on the spinner table 8 and the cleaning nozzle 30.

The water layer forming unit 34 includes a cover 36 surrounding the cleaning nozzle 30, for example. As illustrated in FIGS. 2 and 3, the cover 36 includes a hollow cylindrical side wall 36a and an upper wall 36b closing an upper end of the side wall 36a. The upper wall 36b has an opening defined centrally therein that is complementary in shape to the cleaning nozzle 30. The cleaning nozzle 30 is inserted into the cover 36 through the opening in the upper wall 36b. Note that the cleaning nozzle 30 inserted in the cover 36 has a lower end higher than a lower end of the cover 36.

The lower end of the cover 36, i.e., the side wall 36a, defines a circular opening 36c having a diameter that is typically set to 50 mm. If the workpiece 11 to be cleaned has a diameter of 300 mm, then the diameter of the circular opening 36c is set to 20 mm or more, for example. However, the opening 36c, i.e., the cover 36, is not limited to any particular size. The cover 36 is connected to the second arm 32 such that when the workpiece 11 is cleaned, a gap of 0.5 mm or less is defined between the upper surface 11a of the workpiece 11 held on the spinner table 8 and the opening 36c in the lower end of the cover 36 of the cleaning nozzle 30.

Since the cover 36 is therefore close enough to the workpiece 11 on the spinner table 8 when the workpiece 11 is cleaned, when the cleaning water 21 is ejected from the cleaning nozzle 30 to the workpiece 11 on the spinner table 8, much of the ejected cleaning water 21 stays within the cover 36 upon collision with the workpiece 11, thereby forming a layer of the cleaning water 21 in the clearance between the workpiece 11 and the cleaning nozzle 30.

Some of the ejected cleaning water 21 leaks out of the clearance between the workpiece 11 and the cover 36 and flows along the spinner table 8 into the cleaning case 4. The cleaning water 21 that has entered the cleaning case 4 is drained out of the cleaning apparatus 2 through a drain port 4d defined in the bottom wall 4b, a drain hose 4e connected to the drain port 4d, etc. Note that, after having collided with the workpiece 11, the cleaning water 21 contains swarf 23 removed from the workpiece 11.

An ultrasonic vibrator 38 for applying ultrasonic vibrations to the cleaning water 21 ejected from the cleaning nozzle 30 is mounted on the cleaning nozzle 30, i.e., an upper surface of the upper wall 36b. The ultrasonic vibrator 38 includes a piezoelectric material layer made of a piezoelectric material such as barium titanate, titanate zirconate, lithium tantalate, or lithium niobate and a pair of electrode layers sandwiching the piezoelectric material layer therebetween.

The electrode layers of the ultrasonic vibrator 38 are electrically connected to an alternative current (AC) power supply, not depicted, through electric wires, not depicted.

When the AC power supply supplies AC power to the electrode layers of the ultrasonic vibrator 38, the ultrasonic vibrator 38 vibrates at a frequency commensurate with the frequency of the supplied AC power. In other words, the ultrasonic vibrator 38 generates ultrasonic vibrations that are applied to the cleaning water 21 ejected from the cleaning nozzle 30. The ultrasonic vibrations applied the cleaning water 21 act to enhance the cleaning power of the cleaning water 21, making it easy to remove swarf 23 deposited in grooves in the workpiece 11, etc.

The shaft 26 has a lower end connected to a rotary actuator, not depicted, such as an electric motor. The shaft 26 is rotatable about its central axis parallel to vertical directions by the rotary power transmitted from the rotary actuator. When the shaft 26 is rotated by the rotary actuator, the cleaning nozzle 30 and the water layer forming unit 34 are angularly moved along an arcuate path between, for example, a retracted position above the spinner table 8 and radially outward of the spinner table 8 and a cleaning position directly above the spinner table 8.

As illustrated in FIGS. 2 and 3, the first arm 28 has a flow channel 28a defined therein for the cleaning water 21 to flow therethrough. The flow channel 28a has an end positioned at the proximal end of the first arm 28 and connected to a supply source 40 that supplies the cleaning water 21. The flow channel 28a has another end positioned at the distal end of the first arm 28 and connected to the cleaning nozzle 30. Consequently, the cleaning water 21 is supplied from the supply source 40 through the flow channel 28a to the cleaning nozzle 30.

Note that an external nozzle 42 for supplying the cleaning water 21 to the lower end of the cover 36, i.e., the gap between the workpiece 11 held on the spinner table 8 and the cover 36, on the outside of the cover 36 of the water layer forming unit 34 is disposed outside of the cover 36. The external nozzle 42 is connected to the supply source 40. The cleaning water 21 supplied from the supply source 40 includes pure water, for example.

The second arm 32 has a flow channel (first flow channel) 32a defined therein for the cleaning water 21 to flow therethrough. The flow channel 32a has an end positioned at the distal end of the second arm 32 and connected to the cover 36 of the water layer forming unit 34. The shaft 26 has a joint region 26a defined in its upper end portion for connection to a plurality of flow channels. The flow channel 32a has another end connected sideways to the joint region 26a.

A suction source 44 such as an ejector is connected to an upper end of the joint region 26a through a suction flow channel 26b through which a gas flows. When the suction source 44 is actuated, it produces a negative pressure acting in the joint region 26a, causing the cleaning water 21 staying in the cover 36 to flow through the flow channel 32a into the joint region 26a.

The magnitude of the negative pressure produced by the suction source 44 is adjusted within such a range that the cleaning water 21 staying in the cover 36 flows through the flow channel 32a into the joint region 26a, but not into the flow channel 26b, and the cover 36 is not attracted under suction to the workpiece 11 on the spinner table 8. Note that the suction source 14 referred to above may be used as the suction source 44. A mesh or the like for promoting gas-liquid separation may be disposed in an upper portion of the joint region 26a or the like.

The shaft 26 also has a flow channel (second flow channel) 26c defined below a lower end of the joint region 26a for the cleaning water 21 to flow therethrough. The cleaning water 21 that has flowed into the joint region 26a flows by gravity into the flow channel 26c and is drained out of the shaft 26. The flow channel 32a, the joint region 26a, the flow channel 26b, the flow channel 26c, etc. jointly make up a drain unit 46 for draining the cleaning water 21 that has cleaned the workpiece 11 out of the cleaning apparatus 2.

A turbidimeter 48 for detecting the turbidity of the cleaning water 21 flowing through the flow channel 26c is disposed in a position around the flow channel 26c. The turbidimeter 48 includes a transmissive sensor unit including a light source 50 for emitting a laser beam 25 having a wavelength transmittable through the cleaning water 21, a photodetector 52 that is sensitive to the wavelength of the laser beam 25, and a pair of lenses 54a and 54b disposed between the light source 50 and the photodetector 52.

The lenses 54a and 54b are supported on the shaft 26 outside of respective windows 26d defined in the shaft 26 in diametrically opposite relation, and the light source 50 and the photodetector 52 are aligned with each other through the lenses 54a and 54b and the windows 26d. The light source 50 emits the laser beam 25 through the lens 54a and one of the windows 26d into the cleaning water 21 in the flow channel 26c, and the photodetector 52 measures the intensity of the laser beam 25 that has passed through the cleaning water 21, the other window 26d, and the lens 54b. On the basis of the measured intensity of the laser beam 25, the turbidimeter 48 can detect the turbidity of the cleaning water 21 that varies depending on the amount of swarf 23 contained in the cleaning water 21.

The turbidimeter 48 may detect the turbidity of the cleaning water 21 on principles other than the transmissive measurement type described above. For example, the turbidimeter 48 may be of any desired one of the dispersive light measurement type where the turbidity of the cleaning water 21 is detected on the basis of the intensity of light dispersed by the swarf 23, the transmissive light and dispersive light calculation type where the ratio of transmissive light and dispersive light is used, the integrating sphere measurement type where an integrating sphere is used, etc.

The cleaning apparatus 2 has a controller 56 electrically connected to the photodetector 52 of the turbidimeter 48. The controller 56 determines whether the cleaning of the workpiece 11 has been completed or not on the basis of the turbidity of the cleaning water 21 detected by the turbidimeter 48. Specifically, for example, if the detected turbidity of the cleaning water 21 is lower than, or equal to or lower than, a predetermined threshold value, the controller 56 determines that the cleaning of the workpiece 11 has been completed and controls the cleaning apparatus 2 to finish its cleaning process.

The controller 56 includes a computer including a processor, a storage device, and an input/output device, for example, and is electrically connected to other components of the cleaning apparatus 2, such as the rotary actuator 20 for rotating the spindle 18, the rotary actuator for rotating the shaft 26, etc. The processor typically includes a central processing unit (CPU), and performs various processing sequence for controlling the components of the cleaning apparatus 2.

The storage device includes a main storage unit such as a dynamic random access memory (DRAM) and an auxiliary storage unit such as a hard disk drive, or a flash memory, for example. The input/output device includes a touch panel, for example. The input/output device may alternatively include an input device such as a keyboard, and a mouse, and an output device such as a liquid crystal display that are used in combination with each other. The functions of the controller 56 are realized when the processor operates according to software stored in the storage device, for example. However, the functions of the controller 56 may be solely hardware-implemented.

For cleaning the workpiece 11 on the cleaning apparatus 2 thus configured, first, the workpiece 1 is placed on the spinner table 8 such that the adhesive tape 13 affixed to the workpiece 11 is held in contact with the upper surface 12a of the holding plate 12. Then, the valve connected to the suction source 14 is opened to allow a negative pressure from the suction source 14 to act on the upper surface 12a of the holding plate 12. The workpiece 11 is now held under suction on the spinner table 8 with the upper surface 11a exposed upwardly.

After the workpiece 11 has been held on the spinner table 8, the rotary actuator 20 is energized to rotate the spinner table 8 at a rotational speed in the range from approximately 1 rpm to 10 rpm, for example. As the rotational speed of the spinner table 8 is thus lower than with general spinner cleaning devices, a sufficient amount of cleaning water 21 can stay within the cover 36.

Furthermore, the relatively low rotational speed of the spinner table 8 makes it possible to reduce the size of the rotary actuator 20 compared with high rotational speeds of the spinner table 8. However, the spinner table 8 is not limited to any critical rotational speeds. When the spinner table 8 starts to be rotated, the annular frame 15 is clamped in position on the spinner table 8 by the clamps 16.

Next, the shaft 26 of the cleaning unit 24 is rotated by the rotary actuator coupled therewith, moving the cleaning nozzle 30, the water layer forming unit 34, and the external nozzle 42 from the retracted position to the cleaning position. Then, as illustrated in FIG. 3, the cleaning nozzle 30 ejects the cleaning water 21 toward the workpiece 11 on the spinner table 8. The cleaning water 21 is supplied at a rate adjusted in the range from approximately 0.5 L/min to 1.0 L/min. However, the cleaning water 21 is not limited to any critical supply rates.

When the cleaning nozzle 30 ejects the cleaning water 21, the ultrasonic vibrator 38 may generate and apply ultrasonic vibrations to the cleaning water 21 discharged from the cleaning nozzle 30. The ultrasonic vibrations applied to the cleaning water 21 facilitate the removal of swarf 23 deposited in the grooves in the workpiece 11. When the cleaning nozzle 30 ejects the cleaning water 21, furthermore, the shaft 26 may be rotated about its central axis by the rotary actuator to move the cleaning nozzle 30 back and forth in the cleaning position, thereby cleaning the upper surface 11a of the workpiece 11 effectively in its entirety.

As described above, much of the ejected cleaning water 21 ejected from the cleaning nozzle 30 stays within the cover 36 upon collision with the workpiece 11, and a layer of the cleaning water 21 is formed in the clearance between the workpiece 11 and the cleaning nozzle 30. Therefore, inasmuch the cleaning water 21 ejected from the cleaning nozzle 30 to the workpiece 11 is less likely to be scattered around, the swarf 23 contained in the cleaning water 21 is prevented from being deposited again on the workpiece 11.

Incidentally, while the cleaning nozzle 30 is ejecting the cleaning water 21, the negative pressure from the suction source 44 acts in the joint region 26a. The cleaning water 21 staying within the cover 36 is thus properly drained through the drain unit 46, i.e., the flow channel 32a, the joint region 26a, and the flow channel 26c.

Moreover, while the cleaning nozzle 30 is ejecting the cleaning water 21, the external nozzle 42 may supply the cleaning water 21 to the lower end of the cover 36, i.e., the gap between the workpiece 11 held on the spinner table 8 and the cover 36. The cleaning water 21 supplied from the external nozzle 42 is effective to reduce the amount of cleaning water 21 tending to leak out of the gap between the workpiece 11 and the cover 36, so that the swarf 23 contained in the cleaning water 21 from the gap is effectively prevented from being deposited again on the workpiece 11.

Incidentally, while the cleaning nozzle 30 is ejecting the cleaning water 21, the controller 56 monitors the turbidity of the cleaning water 21 detected by the turbidimeter 48. If the detected turbidity of the cleaning water 21 is lower than, or equal to or lower than, the predetermined threshold value, the controller 56 determines that the cleaning of the workpiece 11 has been completed and controls the cleaning apparatus 2 to finish its cleaning process.

Figure 4:
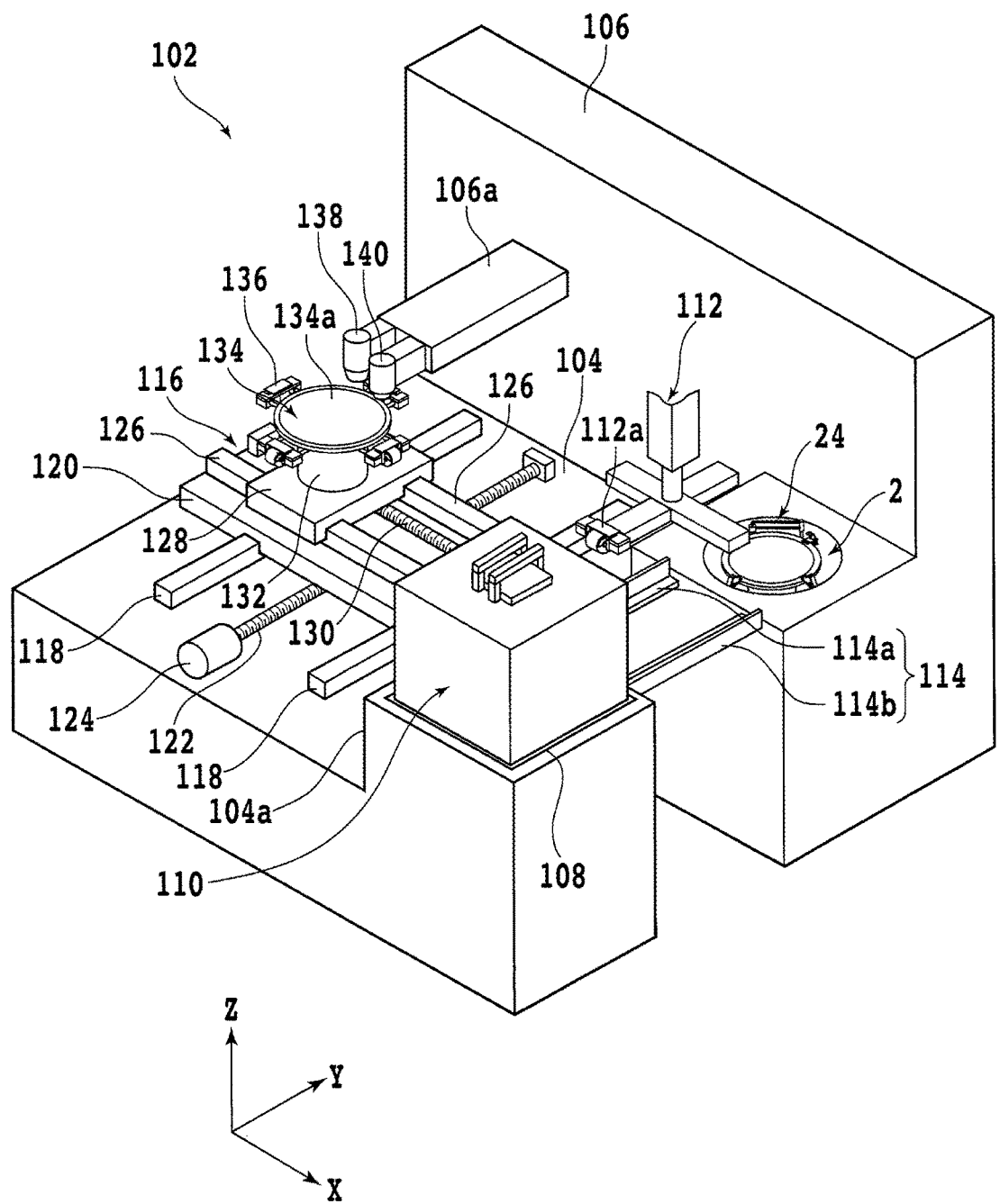
FIG. 4 is a perspective view of a laser processing apparatus incorporating the cleaning apparatus therein.

FIG. 4 illustrates in perspective a laser processing apparatus 102 incorporating the cleaning apparatus 2 therein. Incidentally, in FIG. 4, some components of the laser processing apparatus 102 are omitted from illustration. In FIG. 4, furthermore, X-axis directions (forward and rearward directions or processing feed directions), Y-axis directions (leftward and rightward directions or indexing feed directions), and Z-axis directions (vertical directions or incising feed directions) that are used in the description below of the laser processing apparatus 102 extend perpendicularly to each other.

As illustrated in FIG. 4, the laser processing apparatus 102 includes a foundation base 104 supporting thereon a plurality of components of the laser processing apparatus 102. The laser processing apparatus 102 also includes a columnar or wall-shaped support structure 106 protruding upwardly from a rear end portion of the foundation base 104. The foundation base 104 includes a columnar housing 104a protruding upwardly from a front corner thereof.

The housing 104a has an upper opening defined in an upper end surface thereof and a space defined therein that communicates with the exterior through the upper opening. The housing 104a accommodates in the space a cassette support table 108 having a generally flat upper surface and a lifting and lowering mechanism, not depicted, for lifting and lowering the cassette support table 108. A cassette 110 that houses a plurality of workpieces therein is placed on the cassette support table 108 that is exposed upwardly through the upper opening of the housing 104a.

A delivery unit 112 for delivering the annular frame 15 that supports the workpiece 11 via the adhesive tape 13 is disposed behind the housing 104a. The delivery unit 112 includes a gripper mechanism 112a positioned on a front portion thereof for gripping one of the annular frames 15 supporting the respective workpieces 11 in the cassette 110.

A positioning unit 114 for positioning the annular frame 15 supporting the workpiece 11 is disposed behind the housing 104a. The positioning unit 114 includes a pair of guide rails 114a and 114b movable toward and away from each other while staying parallel to the Y-axis directions, for example. Each of the guide rails 114a and 114b has a horizontal bottom panel for supporting the annular frame 15 thereon and a vertical side panel perpendicular to the bottom panel for positioning the annular frame 15.

One of the annular frames supporting the workpieces 11 housed in the cassette 110 is gripped by the gripper mechanism 112a of the delivery unit 112, and pulled out of the cassette 110 onto the positioning unit 114, i.e., the guide rails 114a and 114b. Thereafter, the guide rails 114a and 114b move toward each other, sandwiching the annular frame 15 in the X-axis directions to position the annular frame 15, i.e., the workpiece 11 in a predetermined position.

A moving mechanism 116 including a processing feed mechanism and an indexing feed mechanism is disposed in a region of the foundation base 104 laterally of the positioning unit 114. The moving mechanism 116 has a pair of Y-axis guide rails 118 fixed to an upper surface of the foundation base 104 and extending generally parallel to the Y-axis directions. A Y-axis movable table 120 is slidably mounted on the Y-axis guide rails 118.

The Y-axis movable table 120 has a nut, not depicted, of a ball screw fixedly mounted on a lower surface thereof. The ball screw also includes a screw shaft 122 rotatably threaded through the nut and extending generally parallel to the Y-axis guide rails 118. The screw shaft 122 has an end coupled to a Y-axis stepping motor 124. When the Y-axis stepping motor 124 is energized, it rotates the screw shaft 122 about its central axis, causing the nut to move the Y-axis movable table 120 in one of the Y-axis directions along the Y-axis guide rails 118.

A pair of X-axis guide rails 126 are fixed to an upper surface of the Y-axis movable table 120 and extend generally parallel to the X-axis directions. An X-axis movable table 128 is slidably mounted on the X-axis guide rails 126. The X-axis movable table 128 has a nut, not depicted, of a ball screw fixedly mounted on a lower surface thereof.

The ball screw also includes a screw shaft 130 rotatably threaded through the nut and extending generally parallel to the X-axis guide rails 126. The screw shaft 130 has an end coupled to an X-axis stepping motor, not depicted. When the X-axis stepping motor is energized, it rotates the screw shaft 130 about its central axis, causing the nut to move the X-axis movable table 128 in one of the X-axis directions along the X-axis guide rails 126.

A $\theta$ table 132 is mounted on an upper surface of the X-axis movable table 128. The $\theta$ table 132 includes a table base rotatable about a central axis generally parallel to the Z-axis directions, for example, and a rotary actuator, not depicted, such as an electric motor coupled to the table base. A chuck table 134 is fixedly mounted on an upper surface of the table base.

The chuck table 134 includes a disk-shaped frame body made of a metal typified by stainless steel, for example. The frame body has a recess defined in an upper surface thereof and having a circular opening defined in an upper end thereof. A disk-shaped porous holding plate made of ceramic or the like is fixedly mounted in the recess in the frame body. The holding plate has an upper surface acting as a holding surface 134a for holding thereon the lower surface 11b of the workpiece 11 with the adhesive tape 13 interposed between the lower surface 11b and the holding surface 134a.

The holding plate has a lower surface connected to a suction source, not depicted, such as an ejector through a flow channel, not depicted, defined in the frame body, a valve, etc., not depicted. When the adhesive tape 13 is placed in contact with the holding surface 134a and the valve is opened to allow a negative pressure generated by the suction source to act on the holding surface 134a through the flow channel, the workpiece 11 is attracted under suction to the chuck table 134 with the adhesive tape 13 interposed therebetween. Four clamps 136 are disposed at circumferentially spaced intervals around the chuck table 134 for clamping the annular frame 15 that supports the workpiece 11 at respective four locations.

A support arm 106a protrudes horizontally from a front surface of the support structure 106. The support arm 106a supports on its distal end an irradiation head, i.e., a processing unit, 138. The irradiation head 138 applies a laser beam generated by a laser oscillator, i.e., the processing unit, not depicted, to an object placed on the holding surface 134a below the irradiation head 138.

The laser beam generated by the laser oscillator is not limited to any critical wavelength. According to the present embodiment, the laser oscillator capable of generating a laser beam having a wavelength absorbable by the workpiece 11. When the laser beam having such a wavelength is applied from the irradiation head 138 to the workpiece 11 while the chuck table 134 is being moved, for example, the workpiece 11 is ablated along a path of movement of the chuck table 134.

A camera, i.e., an image capturing unit, 140 is mounted on the distal end of the support arm 106a laterally of the irradiation head 138. The camera 140 includes a two-dimensional optical sensor such as a complementary metal oxide semiconductor (CMOS) image sensor, or a charge-coupled device (CCD) image sensor that is sensitive in a visible light range, and a focusing lens. The camera 140 captures an image of the workpiece 11 held on the chuck table 134. The captured image is used in an alignment process for adjusting the orientation and position of the workpiece 11, for example.

The cleaning apparatus 2 according to the present embodiment is disposed in the foundation base 104 behind the positioning unit 114. A workpiece 11 that has been processed by the irradiation head 138 is delivered from the chuck table 134 to the cleaning apparatus 2 by the delivery unit 112 and cleaned by the cleaning apparatus 2. Note that the workpiece 11 that has been cleaned by the cleaning apparatus 2 is placed on the positioning unit 114 by the delivery unit 112, and then placed back into the cassette 110.

The components such as the delivery unit 112, the positioning unit 114, the moving mechanism 116, the $\theta$ table 132, the laser oscillator, the camera 140, and the cleaning apparatus 2 are electrically connected to a control unit, not depicted. The control unit includes a computer including a processor, a storage device, and an input/output device, and controls the components described above according to a sequence of steps required to process the workpiece 11.

The processor typically includes a CPU, and performs various processes required to control the components described above. The storage device includes a main storage unit such as a DRAM and an auxiliary storage unit such as a hard disk drive, or a flash memory, for example. The input/output device includes a touch panel, for example. The input/output device may alternatively include an input device such as a keyboard, and a mouse, and an output device such as a liquid crystal display that are used in combination with each other.

The functions of the control unit are realized when the processor operates according to software stored in the storage device, for example. However, the functions of the control unit may be solely hardware-implemented. The control unit of the laser processing apparatus 102 may double as the controller 56 of the cleaning apparatus 2.

As described above, since the cleaning apparatus 2 according to the present embodiment includes the water layer forming unit 34 having the cover 36 that surrounds the cleaning nozzle 30, much of the cleaning water 21 supplied from the cleaning nozzle 30 is confined in the cover 36, thereby forming a layer of the cleaning water 21 in the clearance between the cleaning nozzle 30 and the workpiece 11. Therefore, the cleaning water 21 supplied from the cleaning nozzle 30 to the workpiece 11 is less likely to be scattered around, and the swarf 23 contained in the cleaning water 21 is prevented from being deposited again on the workpiece 11.

The present invention should not be limited to the embodiment described above, but various changes and modifications may be made in the embodiment. For example, some components of the cleaning apparatus 2 may be omitted as long as the swarf 23 contained in the cleaning water 21 is prevented from being deposited again on the workpiece 11. Typically, the external nozzle 42, the turbidimeter 48 of the drain unit 46, etc. may be omitted.

According to the above embodiment, the cover 36 having the circular opening 36c is illustrated by way of example. However, the opening defined in the cover of the cleaning apparatus according to the present invention may have an elliptical shape or the like. In this case, the elliptical opening may have a major axis set to a value in the range from 100 mm to 200 mm, typically 150 mm, and a minor axis set to a value in the range from 20 mm to 100 mm, typically 50 mm.

The elliptical opening defined in the cover allows a nozzle having a linear array of nozzle ports for producing a water curtain to be used as a cleaning nozzle. In this case, much of the cleaning water supplied from the water-curtain nozzle can be confined in the cover, forming a layer of cleaning water in the clearance between the cleaning nozzle and the workpiece.

The structural and operational details according to the above embodiment and modifications may be changed or modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cleaning apparatus comprising:
    a spinner table for holding a workpiece thereon;
    a cleaning nozzle for supplying cleaning water to the workpiece held on the spinner table;
    an ultrasonic vibrator for applying ultrasonic vibrations to the cleaning water supplied from the cleaning nozzle to the workpiece;
    a water layer forming unit for forming a layer of the cleaning water in a clearance between the cleaning nozzle and the workpiece, the water layer forming unit having a cover surrounding the cleaning nozzle; and
    a drain unit for draining the cleaning water out of the cleaning apparatus, the drain unit configured for allowing the cleaning water supplied from the cleaning nozzle to the workpiece to flow therethrough,
    a shaft;
    a first arm having an end connected to the cover and another end connected to the shaft;
    a second arm having an end connected to the cleaning nozzle and another end connected to the shaft; and
    wherein the drain unit includes:
        a first flow channel in the first arm,
        a joint region in the shaft, connected to an end of the first flow channel, and
        a suction flow channel in the shaft, connecting a suction source to the joint region, through which a gas separated from the cleaning water flows,
    wherein the first flow channel is configured for draining the cleaning water from the water layer forming unit, and
    wherein the second arm includes a second flow channel configured for supplying the cleaning water to the cleaning nozzle.

2. The cleaning apparatus according to claim 1, further comprising:
    an external nozzle for supplying the cleaning water toward a gap between the cover of the water layer forming unit and the workpiece, on an outside of the cover.

3. The cleaning apparatus according to claim 1, wherein the shaft includes a third flow channel connected to the lower end of the joint region and the cleaning water in the joint region flows by gravity into the third flow channel.

4. The cleaning apparatus according to claim 1, wherein the drain unit further includes
    a turbidimeter for detecting a turbidity of the cleaning water flowing through the third flow channel and determining whether cleaning of the workpiece has been completed or not.

5. The cleaning apparatus according to claim 2, wherein the shaft including a third flow channel connected to the lower end of the joint region and the cleaning water in the joint region flows by gravity into the third flow channel.

6. The cleaning apparatus according to claim 2, wherein the shaft of the drain unit further includes a turbidimeter for detecting a turbidity of the cleaning water flowing through the shaft and determining whether cleaning of the workpiece has been completed or not.

7. The cleaning apparatus according to claim 5, wherein the drain unit further includes a turbidimeter for detecting a turbidity of the cleaning water flowing through the third flow channel and determining whether cleaning of the workpiece has been completed or not.

8. The cleaning apparatus according to claim 1, wherein when the suction source is actuated, a negative pressure acts in the joint region, causing the cleaning water staying in the cover to flow through the first flow channel into the joint region.

9. The cleaning apparatus according to claim 2, wherein the magnitude of the negative pressure produced by the suction source is adjusted within such a range that the cleaning water staying in the cover flows through the first flow channel into the joint region, but not into the suction flow channel, and the cover is not attracted under suction to the workpiece on the spinner table.

10. The cleaning apparatus according to claim 1, wherein a mesh for promoting gas-liquid separation is disposed in an upper portion of the joint region.

* * * * *